(12) United States Patent
Lee et al.

(10) Patent No.: US 11,915,782 B2
(45) Date of Patent: Feb. 27, 2024

(54) SEMICONDUCTOR DEVICE AND ELECTRONIC DEVICE INCLUDING THE SAME

(71) Applicant: Samsung Electronics Co., Ltd., Suwon-si (KR)

(72) Inventors: Chang Min Lee, Hwaseong-si (KR); Nam Hyung Kim, Seoul (KR); Dae Jeong Kim, Seoul (KR); Do Han Kim, Hwaseong-si (KR); Min Su Kim, Seongnam-si (KR); Deok Ho Seo, Suwon-si (KR); Won Jae Shin, Seoul (KR); Yong Jun Yu, Suwon-si (KR); Il Gyu Jung, Hwaseong-si (KR); In Su Choi, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 17/407,585

(22) Filed: Aug. 20, 2021

(65) Prior Publication Data

US 2022/0208237 A1    Jun. 30, 2022

(30) Foreign Application Priority Data

Dec. 24, 2020  (KR) .................. 10-2020-0182857

(51) Int. Cl.
| | | |
|---|---|---|
| *G11C 7/10* | (2006.01) | |
| *G11C 8/18* | (2006.01) | |
| *G11C 7/14* | (2006.01) | |

(52) U.S. Cl.
CPC ............ *G11C 7/1063* (2013.01); *G11C 7/109* (2013.01); *G11C 7/1012* (2013.01); *G11C 7/14* (2013.01); *G11C 8/18* (2013.01)

(58) Field of Classification Search
CPC ........................................................ G11C 7/10
(Continued)

(56) References Cited

U.S. PATENT DOCUMENTS 7,793,008 B2    9/2010   Hammitt et al.
8,902,694 B2   12/2014   Katayama et al.
(Continued)

FOREIGN PATENT DOCUMENTS

KR    2020-0047814 A    5/2020

OTHER PUBLICATIONS

Changmin Lee, et al."NVDIMM-C:A Byte-Addressable Non-Volatile Memory Modulef or CompatibilitywithS tandard DDRMemory Interfaces" IEEE International Symposium on High Performance Computer Architecture (HPCA)pp. 502-514(2020).*

(Continued)

*Primary Examiner* — Muna A Techane
(74) *Attorney, Agent, or Firm* — Harness, Dickey & Pierce, P.L.C.

(57) ABSTRACT

An electronic device including a memory device with improved reliability is provided. The semiconductor device comprises a data pin configured to transmit a data signal, a command/address pin configured to transmit a command and an address, a command/address receiver connected to the command/address pin, and a computing unit connected to the command/address receiver, wherein the command/address receiver receives a first command and a first address from the outside through the command/address pin and generates a first instruction on the basis of the first command and the first address, and the computing unit receives the first instruction and performs computation based on the first instruction.

19 Claims, 15 Drawing Sheets

(58) Field of Classification Search
USPC .......................................................... 365/191
See application file for complete search history.

(56) References Cited

U.S. PATENT DOCUMENTS

| | | | |
|---|---|---|---|
| 9,582,356 | B1 | 2/2017 | Liu et al. |
| 9,690,505 | B2* | 6/2017 | Benedict ........... G11C 11/40611 |
| 10,248,328 | B2 | 4/2019 | Lee et al. |
| 10,649,927 | B2 | 5/2020 | Raghava et al. |
| 2014/0250263 | A1* | 9/2014 | Danilak ................ G06F 3/0656 |
| | | | 711/103 |
| 2019/0004985 | A1 | 1/2019 | Lee et al. |
| 2019/0018806 | A1 | 1/2019 | Koufaty et al. |
| 2019/0065320 | A1 | 2/2019 | Yoon |
| 2020/0159435 | A1 | 5/2020 | Walker et al. |
| 2020/0167297 | A1 | 5/2020 | Niu et al. |
| 2020/0211633 | A1* | 7/2020 | Okuma ............... G06F 12/0646 |

OTHER PUBLICATIONS

Youngeun Kwon, et al. "TensorDIMM:A Practical Near-MemoryProcessing Architecture for Embeddings and Tensor Operations in DeepLearning" Proceedings of the 52nd Annual IEEE/ACM International Symposium on Micro architecture(MICRO-52)(2019).*

* cited by examiner

SEMICONDUCTOR DEVICE AND ELECTRONIC DEVICE INCLUDING THE SAME

This application claims priority from Korean Patent Application No. 10-2020-0182857, filed on Dec. 24, 2020 in the Korean Intellectual Property Office, the disclosure of which is incorporated herein by reference in its entirety.

BACKGROUND

Inventive concepts relate to a semiconductor device and an electronic device including the same. More particularly, inventive concepts relates to a semiconductor device including a memory device.

Semiconductor memory devices may be divided into non-volatile memory devices such as a flash memory device and volatile memory devices such as a dynamic random access memory (DRAM). The volatile memory devices such as a DRAM are relatively inexpensive and thus are used for storing a large amount of data as in a system memory.

A dual in-line memory module (DIMM) may include a plurality of DRAMs and may include terminals on both sides of a substrate to which the plurality of DRAMs are connected. The DIMM may operate by being mounted in a memory slot of a main board. Recently, as an accelerator is also mounted on the DIMM, the memory module may process data received from a host. Accordingly, an improvement in performance of the DIMM and the accelerator is being pursued.

SUMMARY

Aspects of inventive concepts provide a semiconductor device including a memory device with improved reliability.

Aspects of inventive concepts also provide an electronic device including a memory device with improved reliability.

However, example embodiments of inventive concepts are not restricted to those set forth herein. The above and other example embodiments of inventive concepts will become more apparent to one of ordinary skill in the art to which inventive concepts pertains by referencing the detailed description of inventive concepts given below.

According to some example embodiments of inventive concepts, the semiconductor device comprises a data pin configured to transmit a data signal, a command/address pin configured to transmit a command and an address, a command/address receiver circuitry connected to the command/address pin, and a processor connected to the command/address receiver circuitry, wherein the command/address receiver is configured to receive a first command and a first address, the receiving from an outside through the command/address pin, and the command/address receiver circuitry is configured to generate a first instruction on the basis of the first command and the first address, and the processor is configured to receive the first instruction and perform a computation based on the first instruction.

According to some example embodiments of inventive concepts, the semiconductor device comprises a computing device circuitry, and a memory device connected to the computing device, wherein the computing device circuitry includes a first data pin configured to receive a data signal from an outside, a first interface circuitry configured to receive a command from the outside and an address from the outside and to decode the received command and address, a command/address receiver circuitry configured to receive the decoded command interface circuitry and the address from the first interface circuitry and to generate a first instruction on the basis of the decoded command and address, and a processor configured to receive the generated instruction and to perform a computation based on the first instruction, and the memory device includes a second interfacing device circuitry connected to the first data pin and configured to receive the data signal from the first data pin and to decode the received data signal, a command/address pin configured to receive the command from the first interfacing device circuitry and to receive the address from the first interfacing device circuitry, and a memory module configured to receive the decoded data signal from the second interfacing device and to store the received data signal on the basis of the command and the address.

According to some example embodiments of inventive concepts, the electronic device comprises a host, and a semiconductor device connected to the host through a memory slot, wherein the semiconductor device includes a data pin configured to transmit a data signal from the host, a command/address pin configured to transmit a command from the host and an address from the host, a memory device connected to the data pin and the command/address pin and configured to receive the data signal, the command, and the address, a command/address receiver circuitry connected to the command/address pin, and a processor connected to the command/address receiver, the command/address receiver circuitry is configured to receive the address from the host through the command/address pin and to generate an instruction on the basis of the address, and the processor is configured to output a response signal in response to the instruction and to transmit the response signal to the host.

Other features and example embodiments may be apparent from the following detailed description, the drawings, and the claims.

BRIEF DESCRIPTION OF THE DRAWINGS

The above and other embodiments and features of inventive concepts will become more apparent by describing in detail embodiments thereof with reference to the attached drawings, in which.

DETAILED DESCRIPTION OF SOME EXAMPLE EMBODIMENTS

Hereinafter, example embodiments of inventive concepts will be described with reference to the accompanying drawings.

Figure 1:
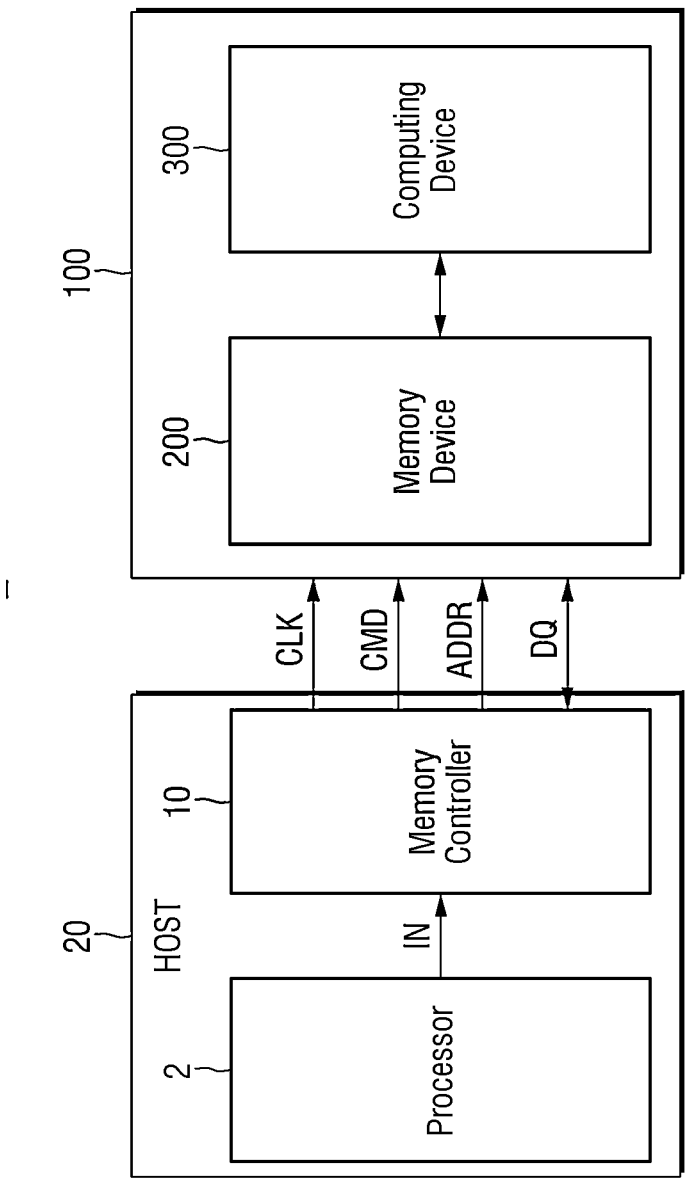
FIG. 1 is a block diagram of an electronic device according to some example embodiments.

FIG. 1 is a block diagram of an electronic device according to some example embodiments.

Referring to FIG. 1, an electronic device 1 according to some example embodiments may include a host 20 and a semiconductor device 100.

The host 20 may control the overall operation of the electronic device 1. The host 20 may include a processor 2 and a memory controller 10. Although the processor 2 is shown to be separate from the memory controller 10, example embodiments are not limited thereto, and the memory controller 10 may be a portion of the processor 2, or the processor 2 may be a portion of the memory controller 10. The processor 2 may control the memory controller 10 by providing an instruction IN to the memory controller 10. The memory controller 10 may control the semiconductor device 100 under the control of the processor 2. The memory controller 10 is illustrated as being included in the host 20, but the example embodiment of inventive concepts is not limited thereto, and the memory controller 10 may not be included in the host 20. The host 20 may include, for example, at least one of a personal computer (PC), a laptop computer, a mobile phone, a smart phone, a tablet PC, and the like. Further, the host 20 may include, for example, at least one of a central processing unit (CPU), a controller, an application specific integrated circuit (ASIC), or the like.

The memory controller 10 may control data exchange between the processor 2 and the semiconductor device 100. The memory controller 10 may write data to the semiconductor device 100 and/or read data from the semiconductor device 100 in response to a request of the processor 2. Specifically, the memory controller 10 may provide a clock signal CLK, a command CMD, and an address ADDR to the semiconductor device 100, and may exchange a data signal DQ with the semiconductor device 100. The memory controller 10 may include at least one of a CPU, a controller, an ASIC, or the like that performs the operation.

The semiconductor device 100 may include a memory device 200 and a computing device 300. The memory device 200 and the computing device 300 may be driven by the memory controller 10. More specifically, the memory device 200 may be driven by the clock signal CLK, the command CMD, and the address ADDR transmitted from the memory controller 10. The computing device 300 may be driven by the data signal DQ, the command CMD, and the address ADDR transmitted from the memory controller 10. The memory device 200 may provide the data signal DQ to the memory controller 10 in response to the command CMD transmitted from the memory controller 10. However, the example embodiment of inventive concepts is not limited thereto.

Figure 2:
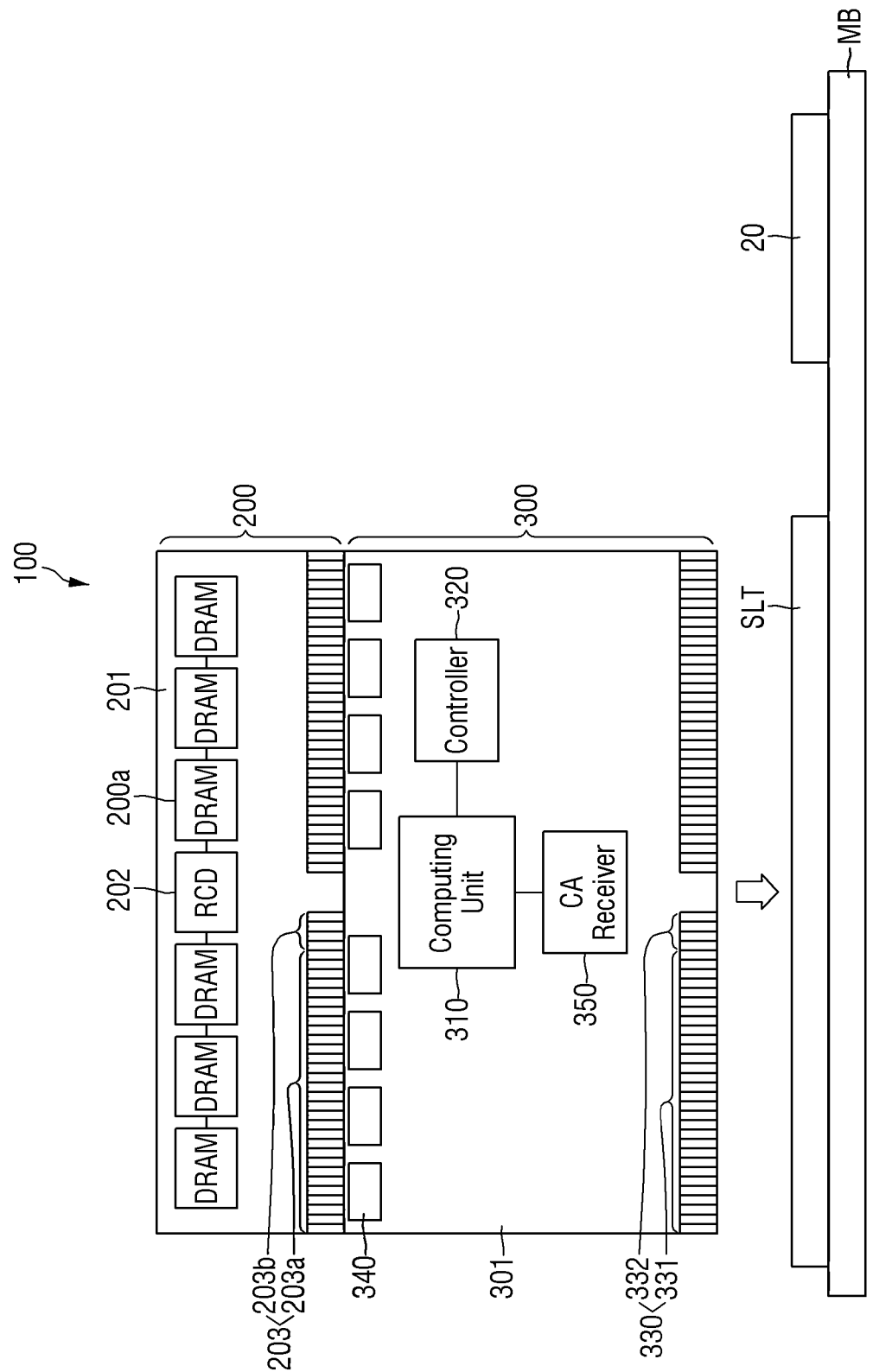
FIG. 2 is a diagram illustrating the electronic device according to some example embodiments.

FIG. 2 is a diagram illustrating the electronic device according to some example embodiments.

Referring to FIG. 2, the semiconductor device 100 may be mounted in a memory slot SLT. Here, the memory slot SLT may be disposed on a main board MB. In addition, the host 20 may be disposed on the main board MB. The host 20 may be electrically connected to the memory slot SLT through the main board MB. For example, the host 20 and the semiconductor device 100 may be electrically connected to and may communicate with each other through the memory slot SLT and the main board MB. The memory slot SLT may also or alternatively be referred to as a memory socket.

The semiconductor device 100 may include the memory device 200 and the computing device 300 connected to each other. Here, the memory device 200 and the computing device 300 may be directly connected to each other, and may be in direct contact with each other. For example, the semiconductor device 100 may refer to a memory device 200 and a computing device 300 that are integrally connected. The semiconductor device 100 may correspond to one semiconductor card.

The memory device 200 may be, or may include, a dual in-line memory module (DIMM). The memory device 200 may include a plurality of memory devices 200a. Here, the plurality of memory devices 200a may be arranged in a line and may be connected to each other.

The memory device 200 may include a substrate 201, a register clock driver (RCD) 202, the plurality of memory devices 200a, and a connection pin 203. The RCD 202, the plurality of memory devices 200a, and the connection pin 203 may be mounted on the substrate 201. In addition, the RCD 202, the plurality of memory devices 200a, and the connection pin 203 may be electrically connected to each other using connection devices included in the substrate 201. The substrate 201 may include a plate made of or comprising an insulator such as plastic, and the substrate 201 may include or support the connection devices connected to the RCD 202, the plurality of memory devices 200a, and the connection pin 203.

The connection pin 203 may be disposed along a lower portion of the substrate 201 and may be disposed such that an upper surface thereof is exposed. The connection pin 203 may be connected to the computing device 300 to electrically connect the computing device 300 to the memory device 200. The connection pin 203 may include a plurality of pins. For example, the connection pin 203 may include a data pin 203a, a command/address pin 203b, and/or the like. Each of the pins of the connection pin 203 may be disposed at different positions of the substrate 201. For example, the data pin 203a may be disposed on an outer side portion of the lower portion of the substrate 201, and the command/address pin 203b may be disposed on an inner side portion of the lower portion of the substrate 201. For example, the data pin 203a and the command/address pin 203b may be sequentially arranged from an outer side of the lower portion of the substrate 201. However, the example embodiments of inventive concepts are not limited thereto, and the positions of the data pin 203a and the command/address pin 203b may be different from the above description.

The RCD 202 may be mounted on the substrate 201. The RCD 202 may be connected to the memory devices 200a and the connection pin 203 through lines formed on the substrate 201. For example, the RCD 202 may be connected to the command/address pin 203b. The RCD 202 may not be connected to the data pin 203a, but example embodiments of inventive concepts are not limited thereto.

The RCD 202 may receive various signals from the host 20 through the command/address pin 203b. For example, the RCD 202 may receive the clock signal CLK, the command CMD, the address ADDR, and/or the like through the command/address pin 203b. The RCD 202 may provide the clock signal CLK, the command CMD, the address ADDR, and/or the like to the plurality of memory devices 200a. Here, the memory device 200 including the RCD 202 may operate based on a registered DIMM (RDIMM).

The plurality of memory devices 200a may be disposed on both sides of the RCD 202. The plurality of memory devices 200a may be arranged in a line and electrically connected to the RCD 202. For example, the memory devices 200a may be connected to the RCD 202 through connection lines of the substrate 201. In addition, the plurality of memory devices 200a may be connected to the data pin 203a. Although omitted in the drawings, a decoder for interfacing the data signal DQ may be present between the plurality of memory devices 200a and the data pin 203a. For example, the decoder may decode the data signal DQ transmitted from the data pin 203a according to a DIMM protocol, and transmit the decoded data signal DQ to the memory devices 200a. However, example embodiments of inventive concepts are not limited thereto, and the memory devices 200a may be directly connected to the data pin 203a.

Further, the memory device 200a may output the data signal DQ and transmit the data signal DQ to the data pin 203a. For example, the memory device 200a may operate based on the command CMD and address ADDR, which are received from the RCD 202 and the command/address pin 203b, and the data signal DQ received through the data pin 203a.

The memory device 200a may include various memories, such as at least one of a dynamic random access memory (DRAM), a phase change random access memory (PRAM), a ferroelectric random access memory (FRAM), a magnetic random access memory (MRAM), a resistive random access memory (RRAM), a flash memory, and/or the like. Furthermore, each of the memory device 200a may be the same type of memory, or may be different types of memory. For example one or more of the memory devices 200a may be a DRAM device, and another or more of the memory devices 200a may be a PRAM device; however, example embodiments are not limited thereto. As used herein, the description will be made on the assumption that the memory device 200a is a DRAM device.

The computing device 300 may be connected, or directly connected, to the memory device 200. For example, the computing device 300 may be directly connected to the connection pin 203 of the memory device 200. The computing device 300 may exchange data with the memory device 200 through the connection pin 203. The semiconductor device 100 may operate integrally as the computing device 300 and the memory device 200 exchange data through the connection pin 203.

The computing device 300 may include a substrate 301, a computing unit 310, a controller 320, a connection pin 330, multiplexers 340, a command/address receiver 350, and the like. The computing unit 310, the controller 320, the connection pin 330, the multiplexers 340, and the command/address receiver 350 may be mounted on the substrate 301. In addition, the computing unit 310, the controller 320, the connection pin 330, the multiplexers 340, and the command/address receiver 350 may be electrically connected to each other using connection devices included in the substrate 301. The substrate 301 may include a plate made of or comprising an insulator such as plastic, and the substrate 301 may include or support the connection devices connected to the computing unit 310, the controller 320, the connection pin 330, the multiplexers 340, and the command/address receiver 350.

The connection pin 330 may be disposed along a lower portion of the substrate 301. The connection pin 330 may be connected to the memory slot SLT to electrically connect the computing device 300 to the host 20. The connection pin 330 may include a plurality of pins. For example, the connection pin 330 may include a data pin 331, a command/address pin 332, and the like. Each of the pins of the connection pin 330 may be disposed at different positions of the substrate 301. For example, the data pin 331 may be disposed on an outer side portion of the lower portion of the substrate 301, and the command/address pin 332 may be disposed on an inner side portion of the lower portion of the substrate 301. For example, the data pin 331 and the command/address pin 332 may be sequentially arranged from an outer side of the lower portion of the substrate 301. However, example embodiments of inventive concepts are not limited thereto, and the positions of the data pin 331 and the command/address pin 332 may be different from the above description.

The computing unit 310 may be mounted on a central portion of the substrate 301; for example, a center of the computing unit 310 may be aligned to a center of the substrate 301. The computing unit 310 may be connected to the controller 320, the multiplexers 340, the command/address receiver 350, and the connection pin 330, and may process the received signal to output the processed signal. The computing unit 310 may be or may include an accelerator. For example, the computing unit 310 may be or may include a field programmable gate array (FPGA) programmed according to a specific method. The computing unit 310 may process received data under the control of the controller 320 and may output the processed data to the host 20.

The command/address receiver 350 may receive the command CMD and the address ADDR that are transmitted from the host 20. The command CMD may be received before, after, or simultaneously with the address ADDR. The command/address receiver 350 may be connected to the command/address pin 332. The command/address receiver 350 may receive the command CMD and the address ADDR through the command/address pin 332. For example, the command/address receiver 350 may monitor the command CMD and the address ADDR transmitted to the memory device 200. The command/address receiver 350 may generate an instruction INS on the basis of the received command CMD and address ADDR, and may provide the generated instruction INS to the computing unit 310. This will be described in detail below.

The multiplexers 340 may be disposed along an upper portion of the substrate 301. The multiplexers 340 may connect the connection pin 330 and to the connection pin 203. For example, the semiconductor device 100 may be electrically connected to the host 20 through the multiplexers 340, the connection pin 330, and the connection pin 203. For example, the data pin 331 of the computing device 300 may be connected to the data pin 203a of the memory device 200 through the multiplexers 340. The command/address pin 332 of the computing device 300 may be connected to the command/address pin 203b of the memory device 200 through the multiplexers 340. Although omitted in the drawings, the computing device 300 may include a decoder configured to interface the received signal and connected to the connection pin 330.

Figure 3:
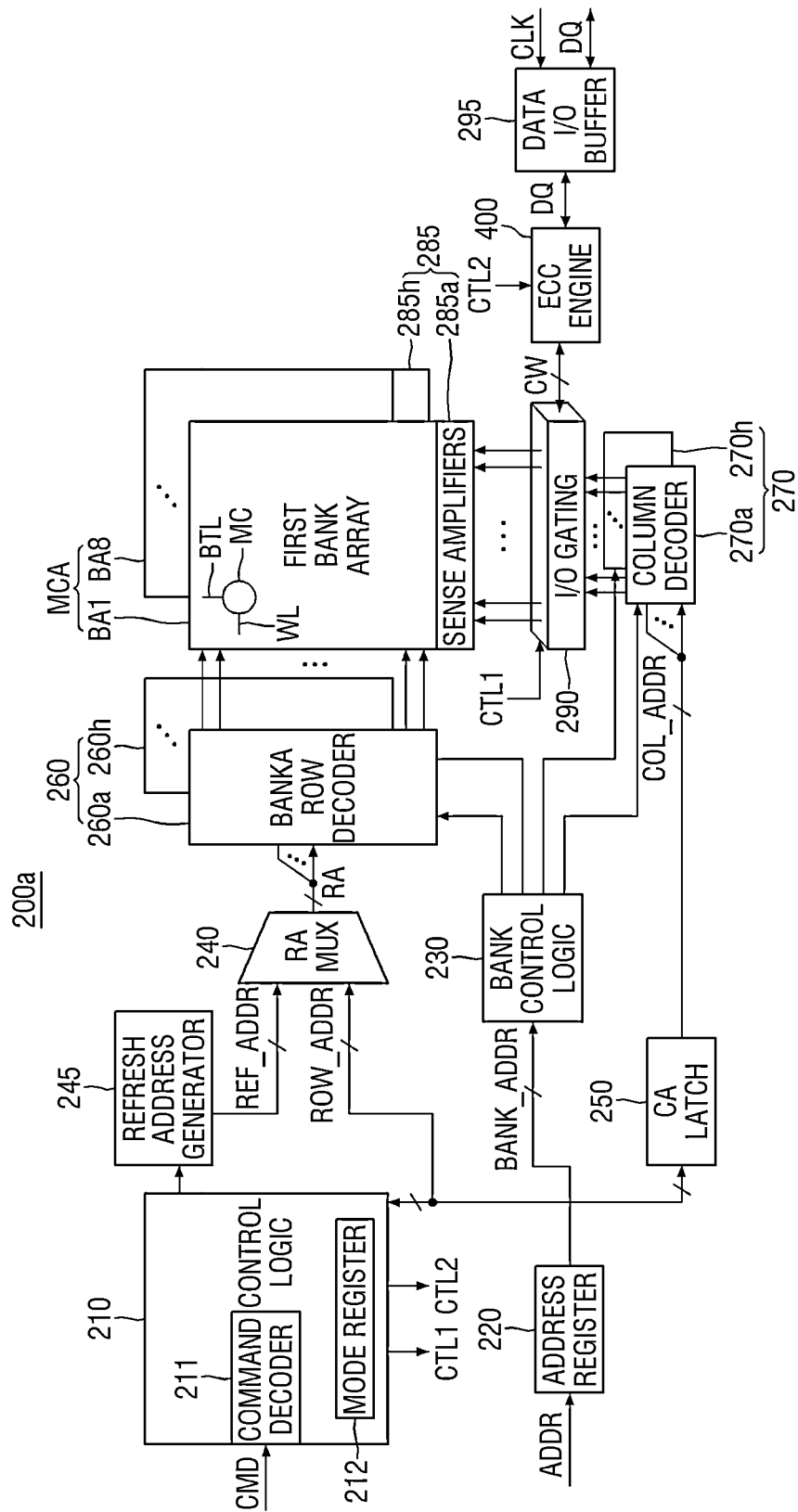
FIG. 3 is a block diagram of the memory device according to some example embodiments.

FIG. 3 is a block diagram of the memory device according to some example embodiments.

Referring to FIG. 3, each of the memory devices 200a include a control logic 210, an address register 220, a bank control logic 230, a row address multiplexer 240, a refresh address generator 245, a column address latch 250, a row decoder 260, a column decoder 270, a sense amplifier unit 285, an input/output (I/O) gating circuit 290, a memory cell array MCA, an error correction code (ECC) engine 400, and a data I/O buffer 295.

The memory cell array MCA may include a plurality of memory cells MC for storing data. Specifically, the memory cell array MCA may include a plurality of banks, for example first to eighth bank arrays BA1 to BA8. Each of the first to eighth bank arrays BA1 to BA8 may include a plurality of word lines WL, a plurality of bit lines BTL, and the plurality of memory cells MC formed at intersections between the word lines WL and the bit lines BTL. The number of word lines WL may be the same as, more than, or less than the number of bit lines BTL. The word lines WL may be referred to as row lines, and/or the bit lines BTL may be referred to as column lines; however, example embodiments are not limited thereto.

The plurality of memory cells MC may include the first to eighth bank arrays BA1 to BA8. The memory device 200a is illustrated in FIG. 3 as including eight bank arrays BA1 to BA8, but is not limited thereto, and may include any number of bank arrays, e.g. more than eight or less than eight.

The control logic 210 may control an operation of the memory device 200a. For example, the control logic 210 may generate control signals to perform an operation of writing data to and/or reading data from the memory device 200a. The control logic 210 may include a command decoder 211 configured to decode the command CMD received from the memory controller 10, and a mode register 212 for setting an operation mode of the memory device 200a.

For example, the command decoder 211 may generate control signals corresponding to the command CMD by decoding a write enable signal /WE, a row address strobe signal /RAS, a column address strobe signal /CAS, a chip select signal /CS, and/or the like. The control logic 210 may also receive the clock signal CLK and a clock enable signal in order to drive the memory device 200a in a synchronous manner.

Further, the control logic 210 may control the refresh address generator 245 to generate a refresh row address REF_ADDR in response to a refresh command.

The address register 220 may receive the address ADDR from the memory controller 10. For example, the address register 220 may receive the address ADDR including a bank address BANK_ADDR, a row address ROW_ADDR, and a column address COL_ADDR. The address register 220 may provide the received bank address BANK_ADDR to the bank control logic 230, provide the received row address ROW_ADDR to the row address multiplexer 240, and may provide the received column address COL_ADDR to the column address latch 250.

The bank control logic 230 may generate bank control signals in response to the bank address BANK_ADDR received from the address register 220. One of first to eighth bank row decoders 260a to 260h corresponding to the bank address BANK_ADDR may be activated in response to the bank control signals, and one of first to eighth bank column decoders 270a to 270h corresponding to the bank address BANK_ADDR may be activated in response to the bank control signals.

The row address multiplexer 240 may receive the row address ROW_ADDR from the address register 220 and may receive the refresh row address REF_ADDR from the refresh address generator 245. The row address multiplexer 240 may selectively output the row address ROW_ADDR received from the address register 220 and/or the refresh row address REF_ADDR received from the refresh address generator 245 as a row address RA. The row address RA that is output from the row address multiplexer 240 may be applied to each of the first to eighth bank row decoders 260a to 260h.

The refresh address generator 245 may generate the refresh row address REF_ADDR for refreshing the memory cells. The refresh address generator 245 may provide the refresh row address REF_ADDR to the row address multiplexer 240. Accordingly, the memory cells disposed in the word line corresponding to the refresh row address REF_ADDR may be refreshed. For example, the bits stored in the memory cells may be read and rewritten into the memory cells.

The column address latch 250 may receive the column address COL_ADDR from the address register 220 and temporarily store the received column address COL_ADDR. In addition, the column address latch 250 may gradually increase the received column address COL_ADDR in a burst mode. The column address latch 250 may apply the temporarily stored or gradually increased column address COL_ADDR to each of the first to eighth bank column decoders 270a to 270h.

The row decoder 260 may include the first to eighth bank row decoders 260a to 260h respectively connected to the first to eighth bank arrays BA1 to BA8. The column decoder 270 may include the first to eighth bank column decoders 270a to 270h respectively connected to the first to eighth bank arrays BA1 to BA8. The sense amplifier unit 285 may include first to eighth bank sense amplifiers 285a to 285h respectively connected to the first to eighth bank arrays BA1 to BA8. The sense amplifier unit 285 may include a pair of cross-coupled inverters; however, example embodiments are not limited thereto.

The bank row decoder, among the first to eighth bank row decoders 260a to 260h, activated by the bank control logic 230 may decode the row address RA output from the row address multiplexer 240 and activate the word line corresponding to the row address RA. For example, the activated bank row decoder may apply a word line driving voltage to the word line corresponding to the row address RA.

The bank column decoder, among the first to eighth bank column decoders 270a to 270h, activated by the bank control logic 230 may activate a bank sense amplifier, among the bank sense amplifiers 285a to 285h, corresponding to the bank address BANK_ADDR and the column address COL_ADDR through the I/O gating circuit 290.

The I/O gating circuit 290 may include circuits for gating input/output data, and further include an input data mask logic, read data latches for storing data that is output from the first to eighth bank arrays BA1 to BA8, and write drivers for writing data to the first to eighth bank arrays BA1 to BA8.

A code word CW to be read from one bank array of the first to eighth bank arrays BA1 to BA8 may be sensed by a bank sense amplifier, among the bank sense amplifiers 285a to 285h, corresponding to the one bank array and stored in the read data latches. The ECC engine 400 may perform ECC decoding on the code word CW stored in the read data latches. When an error is detected in data of the code word CW, the ECC engine 400 may provide the corrected data signal DQ to the memory controller 10 through the data I/O buffer 295.

The data signal DQ to be written to one bank array among the first to eighth bank arrays BA1 to BA8 may be provided to the ECC engine 400, the ECC engine 400 may generate parity bits on the basis of the data signal DQ and provide the data signal DQ and the parity bits to the I/O gating circuit 290, and the I/O gating circuit 290 may write the data signal DQ and the parity bits to a sub-page of the one bank array through the write drivers.

The data I/O buffer 295 may provide the data signal DQ to the ECC engine 400 on the basis of the clock signal CLK provided from the memory controller 10 in a write operation, and may provide the data signal DQ provided from the ECC engine 400 to the memory controller 10 in a read operation.

Here, the data signal DQ may be transmitted to the memory device 200a from the host 20 through the data pin 203a, and the command CMD and the address ADDR may be transmitted to the memory device 200a from the host 20 through the command/address pin 203b. More specifically, the command CMD and the address ADDR may be transmitted to the RCD 202 through the command/address pin 203b, and the RCD 202 may transmit the command CMD and the address ADDR to the memory device 200a.

There may be other components such as a redundancy array (not illustrated). The redundancy array may include redundant cells, along with redundant bit lines and redundant word lines. The redundancy array may be programmed to replace cells in the first bank array that are defective. For example the redundancy array may be programmed after the DRAM 200a is fabricated. However, example embodiments are not limited thereto.

Figure 4:
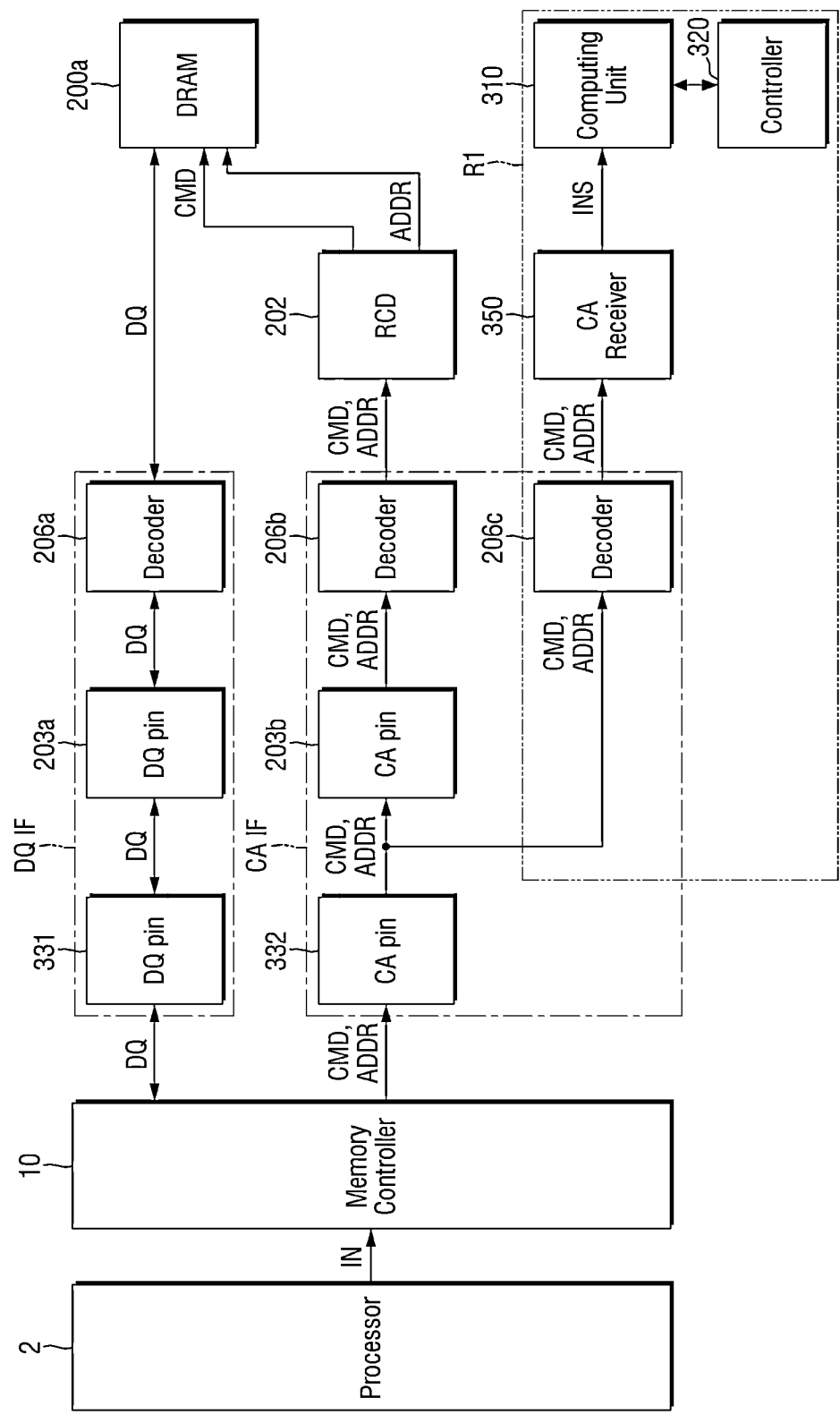
FIG. 4 is a block diagram of the electronic device according to some example embodiments.

FIG. 4 is a block diagram of the electronic device according to some example embodiments.

Referring to FIGS. 1 to 4, the electronic device may include a data interface DQ IF and a command/address interface CA IF. The data interface DQ IF and the command/address interface CA IF may exchange data between the memory controller 10 and the semiconductor device 100. That is, the data exchanged between the host 20 and the semiconductor device 100 may be interfaced by the data interface DQ IF and the command/address interface CA IF. The data interface DQ IF and the command/address interface CA IF may connect the host 20, the memory device 200, and the computing device 300.

The data interface DQ IF may include the data pin 331, the data pin 203a, and a decoder 206a, and the like. Here, the data pin 331 may be included in the computing device 300, and the data pin 203a and the decoder 206a may be included in the memory device 200. However, the example embodiment of inventive concepts is not limited thereto, and the decoder 206a configured to decode the data signal DQ may be included in the computing device 300.

The data pin 331, the data pin 203a, and the decoder 206a of the data interface DQ IF may transmit and receive the data signal DQ. That is, the data pin 331, the data pin 203a, and the decoder 206a may transmit the data signal DQ received from the host 20 to the memory device 200a. In addition, the data pin 331, the data pin 203a, and the decoder 206a may transmit the data signal DQ received from the memory device 200a to the host 20 or the memory controller 10. Here, the decoder 206a may decode the data signal DQ according to a memory protocol (e.g., a double data rate (DDR) protocol or a DIMM protocol). For example, the data signal DQ may be a signal interfaced according to the memory protocol. However, the example embodiment of inventive concepts is not limited thereto, and the data signal DQ may be decoded in another manner.

The command/address interface CA IF may include the command/address pin 332, the command/address pin 203b, a decoder 206b, a decoder 206c, and the like. Here, the command/address pin 332 and the decoder 206c may be included in the computing device 300, and the command/address pin 203b and the decoder 206b may be included in the memory device 200. However, the example embodiment of inventive concepts is not limited thereto.

The command/address pin 332, the command/address pin 203b, the decoder 206b, and the decoder 206c of the command/address interface CA IF may transmit the command CMD and the address ADDR. For example, the command/address pin 332, the command/address pin 203b, and the decoder 206b may transmit the command CMD and the address ADDR received from the host 20 to the RCD 202 of the memory device 200. The command CMD and the address ADDR, which are transmitted to the RCD 202, may have been decoded by the decoder 206b. Here, the decoder 206b may decode the command CMD and the address ADDR according to a memory protocol (e.g., a DDR protocol or a DIMM protocol). However, example embodiments of inventive concepts are not limited thereto, and the address ADDR and the command CMD may be decoded in another manner.

For example, the command/address pin 332 and the decoder 206c may transmit the command CMD and the address ADDR to the command/address receiver 350. The command CMD and the address ADDR, which are transmitted to the command/address receiver 350, may have been decoded by the decoder 206c. Here, the decoder 206c may decode the command CMD and the address ADDR according to a memory protocol (e.g., a DDR protocol and/or a DIMM protocol). However, example embodiments of inventive concepts are not limited thereto, and the address ADDR and the command CMD may be decoded in another manner. Alternatively or additionally, the command CMD and the address ADDR may be simultaneously transmitted to the RCD 202 and the command/address receiver 350. For example, the same command CMD and address ADDR may be transmitted to the RCD 202 and the command/address receiver 350.

The memory device 200a may receive the data signal DQ from the decoder 206a, and may receive the command CMD and the address ADDR from the RCD 202. The memory device 200a may store the data signal DQ on the basis of the command CMD and the address ADDR, as described above.

The command/address receiver 350 may receive the command CMD and the address ADDR from the decoder 206c. The command/address receiver 350 may output the instruction INS in response to the received command CMD and address ADDR. The command/address receiver 350 may transmit the instruction INS output from the command/address receiver 350 to the computing unit 310. The computing unit 310 may perform computation on the basis of the received instruction INS. For example, the computing unit 310 may perform the computation using the instruction INS that is generated based on the command CMD and the address ADDR received through the command/address interface CA IF. Hereinafter, the command/address receiver 350 and the computing unit 310 will be described in more detail.

Figure 5:
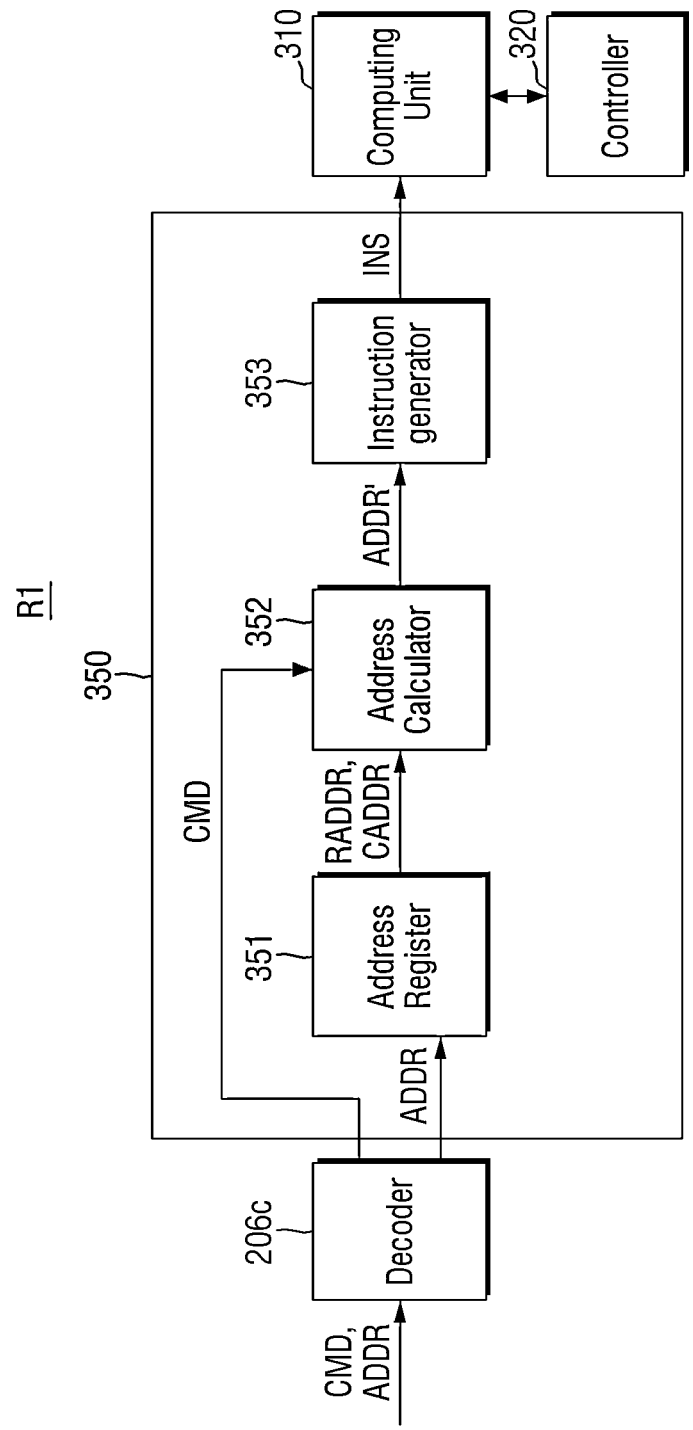
FIG. 5 is a block diagram of the semiconductor device corresponding to region R1 of FIG. 4.
Figure 6:
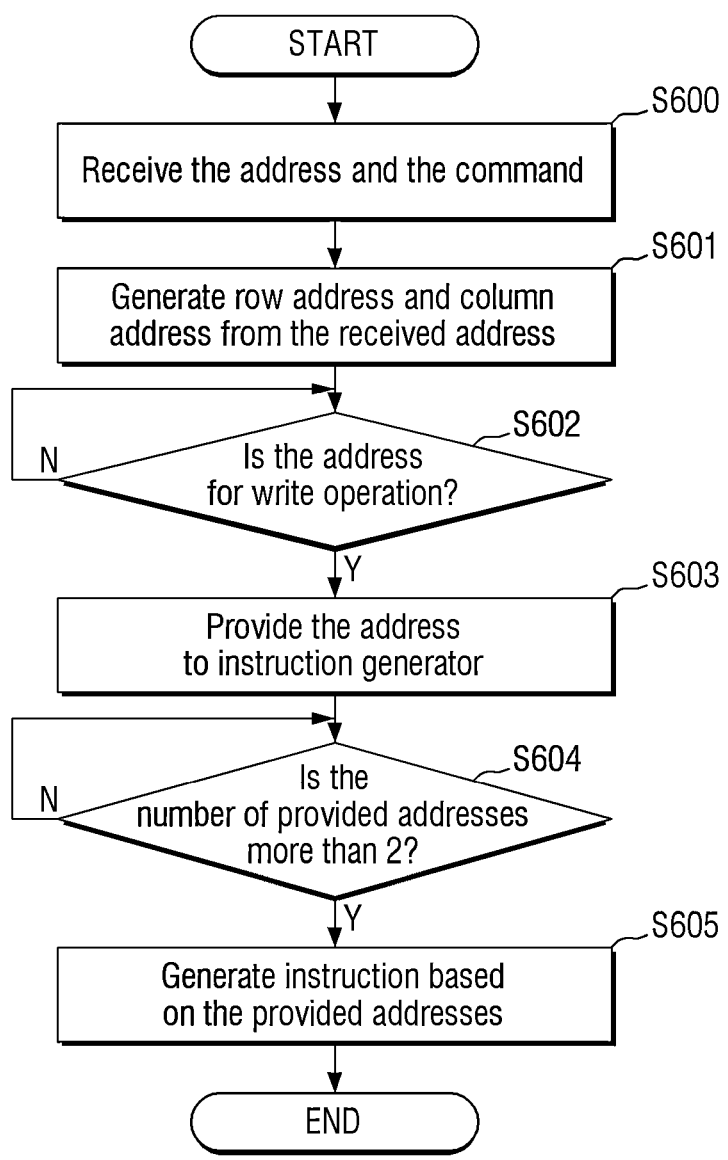
FIG. 6 is a flowchart for describing an operation of the semiconductor device of FIG. 5.

FIG. 5 is a block diagram of the semiconductor device corresponding to region R1 of FIG. 4. FIG. 6 is a flowchart for describing an operation of the semiconductor device of FIG. 5.

Referring to FIGS. 5 and 6, the command/address receiver 350 may include an address register 351, an address calculator 352, and an instruction generator 353. The command/address receiver 350 may receive the command CMD and the address ADDR from the decoder 206c (S600).

The address register 351 may receive the address ADDR from the decoder 206c. The address register 351 may generate a row address RADDR and a column address CADDR using the address ADDR. For example, the address register 351 may output the row address RADDR and the column address CADDR included in the address ADDR. For example, the address ADDR may be a combination of the row address RADDR and the column address CADDR. Here, example embodiments of inventive concepts are not limited thereto, and the address ADDR may include a bank address.

The address calculator 352 may receive the row address RADDR and the column address CADDR from the address register 351, and may receive the command CMD from the decoder 206c. The address calculator 352 may determine whether the corresponding address ADDR is for a write operation on the basis of the received command CMD, row address RADDR, and column address CADDR (S602). For example, the address ADDR may be for a write operation when the command CMD is a write command, and the address ADDR may be for a read operation when the command CMD is a read command.

When the address ADDR is for the write operation (S602-Y), the address calculator 352 may provide an address ADDR' to the instruction generator 353 (S603). For example, when the command CMD is the write command, the address calculator 352 may generate the address ADDR' on the basis of the row address RADDR and the column address CADDR. The address ADDR' may be the same as the address ADDR provided by the address register 351, but example embodiments of inventive concepts are not limited thereto. The address ADDR may include a bank address in addition to the row address RADDR and the column address CADDR. When the address ADDR is not for the write operation (S602-N), the address calculator 352 may not provide the address ADDR' to the instruction generator 353.

The instruction generator 353 may receive the address ADDR' from the address calculator 352. For example, the instruction generator 353 may receive a plurality of addresses ADDR' from the address calculator 352. Here, the plurality of addresses ADDR' may be addresses transmitted from the address register 351 and the address calculator 352.

The instruction generator 353 may determine whether the number of the addresses ADDR' received from the address calculator 352 is more than 2 (S604). For example, the instruction generator 353 may determine whether the number of the addresses ADDR' received from the address calculator 352 is greater than or equal to 3. For example, when the number of the addresses ADDR' received from the address calculator 352 is less than or equal to 2 (S604 -N), the instruction generator 353 may perform the above-described operation again. For example, when the number of the addresses ADDR' received from the address calculator 352 is more greater or equal to 3 (S604-Y), the instruction generator 353 may generate the instruction INS on the basis of the received addresses ADDR' (S605). For example, the instruction generator 353 may combine the plurality of addresses ADDR' to generate the instruction INS. For example, the instruction generator 353 may combine three addresses ADDR' to generate one instruction INS. For example, the command/address receiver 350 may generate and output the instruction INS on the basis of the command CMD and the address ADDR that are received through the command/address interface CA IF. For example, the instruction INS may be transmitted to the computing unit 310 without being transmitted through the data interface DQ IF or the memory device 200a. The computing unit 310 may perform computation on the basis of the received instruction INS.

Figure 7:
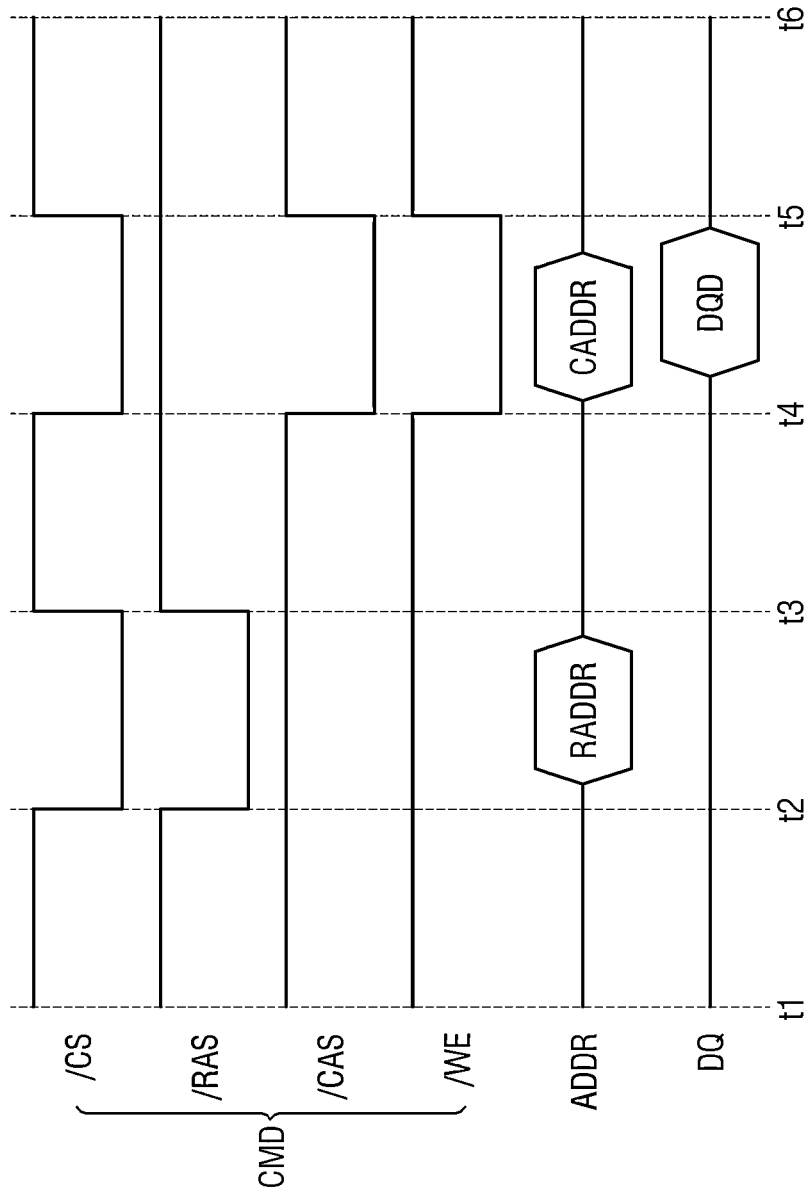
FIG. 7 is a timing diagram for describing the operation of the semiconductor device of FIG. 4.
Figure 8:
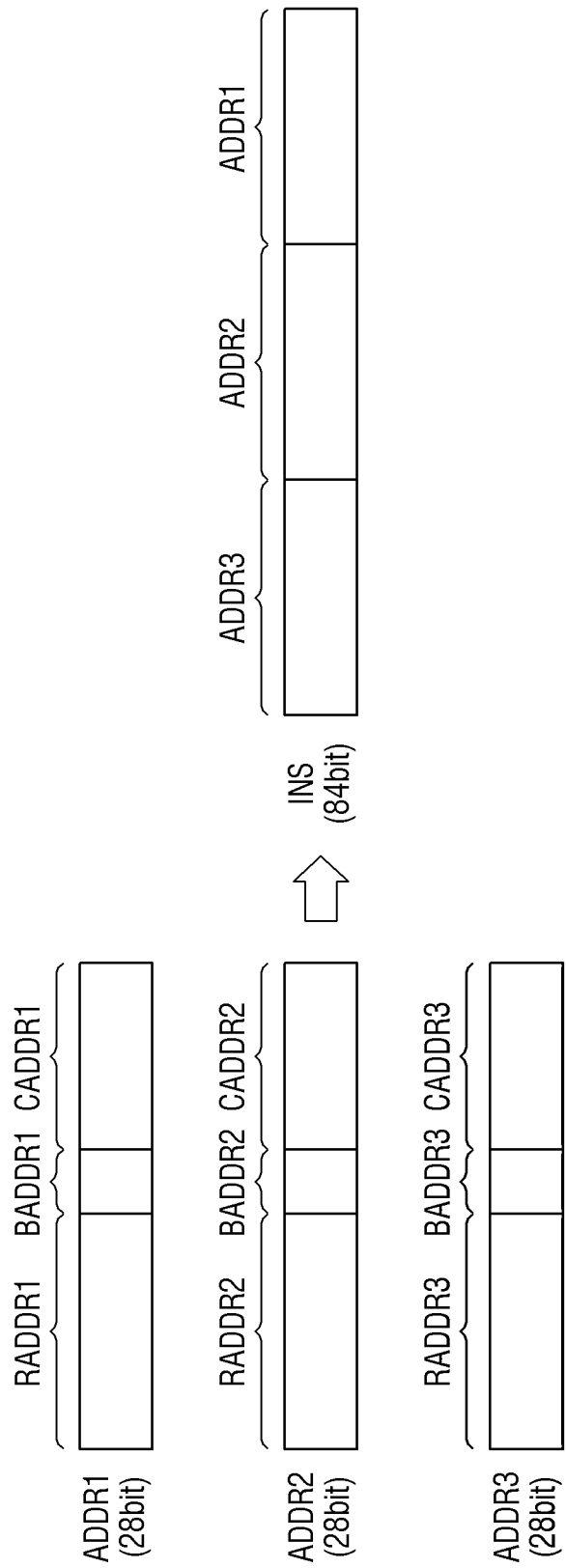
FIGS. 8 and 9 are diagrams for describing the semiconductor device of FIG. 4.
Figure 9:
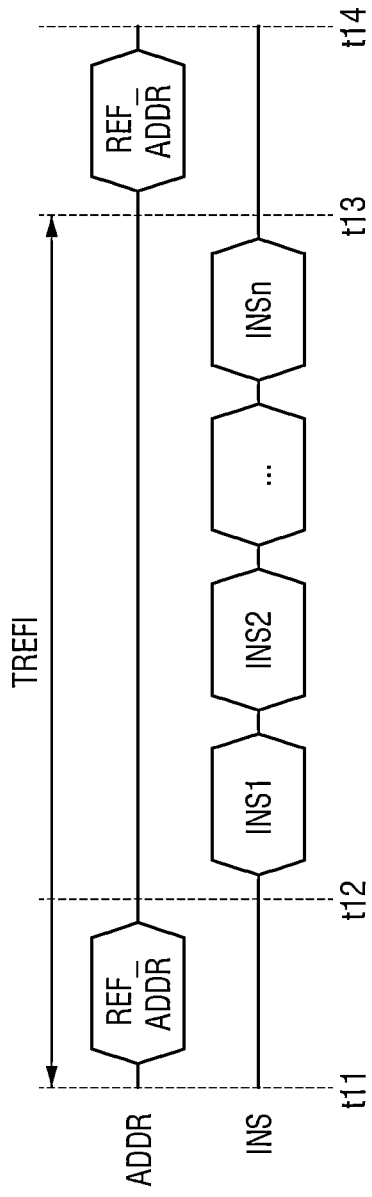

FIG. 7 is a timing diagram for describing the operation of the semiconductor device of FIG. 4. FIGS. 8 and 9 are diagrams for describing the semiconductor device of FIG. 4.

Referring to FIGS. 3 to 7, the command CMD and the address ADDR may be transmitted to the memory device 200a and the command/address receiver 350 through the command/address interface CA IF, and the data signal DQ may be transmitted to the memory device 200a through the data interface DQ IF. That is, the command/address receiver 350 may monitor the command CMD and the address ADDR transmitted to the memory device 200a.

The command CMD may include the write enable signal /WE, the row address strobe signal /RAS, the column address strobe signal /CAS, the chip select signal /CS, and the like. The memory device 200a may operate according to the combination of the above-described signals.

Each of the write enable signal /WE, the row address strobe signal /RAS, the column address strobe signal CAS, and the chip select signal /CS are illustrated as being active-low signals; however, example embodiments are not limited thereto, and any one or more than one of the above signals may be active high signals.

At a first time t1, the write enable signal /WE, the row address strobe signal /RAS, the column address strobe signal /CAS, and the chip select signal /CS may all be in a high state. At a second time t2, the chip select signal /CS and the row address strobe signal /RAS may be in a low state, and the row address RADDR may be transmitted to the row decoder 260. Accordingly, a word line driving voltage may be applied to the word line corresponding to the row address RADDR.

At a third time t3, the chip select signal /CS and the row address strobe signal /RAS may be in the high state again. In addition, at a fourth time t4, the chip select signal /CS, the write enable signal /WE, and the column address strobe signal /CAS may be in the low state, and the column address CADDR may be transmitted to the column decoder 270. Accordingly, a dummy data signal DQD may be written to the selected memory cell array MCA. Here, the dummy data signal DQD may be data randomly provided from/generated by the host 20. For example, since the address ADDR including the row address RADDR and the column address CADDR is for generating the instruction INS provided to the computing unit 310, the dummy data signal DQD may be randomly provided, e.g. may be a random string generated, for example, by a random number generator (RNG) circuitry (not shown).

Referring to FIGS. 5 and 8, the address ADDR', which is output from the address calculator 352, may include a first address ADDR1, a second address ADDR2, and a third address ADDR3. For example, the first address ADDR1, the second address ADDR2, and the third address ADDR3 may all be transmitted to the instruction generator 353. The first address ADDR1, the second address ADDR2, and the third address ADDR3 may each have 28 bits. However, example embodiments of inventive concepts are not limited thereto, and the first address ADDR1, the second address ADDR2, and the third address ADDR3 may each have more or less than 28 bits, such as 34 bits. However, only a portion of the first address ADDR1, the second address ADDR2, and the third address ADDR3 may be used to generate the instruction INS.

The first address ADDR1 may include a row address RADDR1, a bank address BADDR1, and a column address CADDR1, the second address ADDR2 may include a row address RADDR2, a bank address BADDR2, and a column address CADDR2, and the third address ADDR3 may include a row address RADDR3, a bank address BADDR3, and a column address CADDR3.

When the first address ADDR1, the second address ADDR2, and the third address ADDR3 are transmitted to the instruction generator 353, the instruction generator 353 may generate the instruction INS on the basis of the first address ADDR1, the second address ADDR2, and the third address ADDR3. Here, the instruction INS may be formed by combining (e.g. concatenating) the first address ADDR1, the second address ADDR2, and the third address ADDR3. Accordingly, the instruction INS may have 84 bits. However, example embodiments of inventive concepts are not limited thereto. Accordingly, the generated instruction INS may be transmitted to the computing unit 310, and the computing unit 310 may perform computation on the basis of the instruction INS.

Referring to FIGS. 3 to 6 and 9, the refresh row address REF_ADDR may be generated for every refresh row address generation period TREFI. For example, the refresh address generator 245 may generate the refresh row address REF_ADDR, and accordingly, the memory cell array MCA may be refreshed. The refresh row address generation period TREFI may be or may correspond to a time interval from a first time t11 to a third time t13, and the refresh row address REF_ADDR may be generated one time during the corresponding time interval. For example, the refresh row address REF_ADDR may be generated during a time interval from the first time t11 to a second time t12, and may be generated during a time interval from the third time t13 to a fourth time t14.

The instructions INS may be generated without being limited to, e.g. may be independent of, the refresh row address generation period TREFI. For example, the command/address receiver 350 may generate and output a plurality of instructions INS1 to INSn. Alternatively or additionally, the host 20 may transmit the plurality of addresses ADDR to the semiconductor device 100, and the plurality of instructions INS1 to INSn may be generated on the basis of the plurality of addresses ADDR. The plurality of instructions INS1 to INSn are not dependent on the refresh row address generation period TREFI. For example, even when the refresh row address REF_ADDR is generated one time during the refresh row address generation period TREFI, the plurality of instructions INS1 to INSn may be generated multiple times during the refresh row address generation period TREFI. For example, since the address ADDR and the command CMD are transmitted to the command/address receiver 350 through the command/address interface CA IF, and the command/address receiver 350 generates the instruction INS, the instruction INS may be transmitted to the computing unit 310 without being limited by, e.g. may be independent of, the operation of the memory device 200a. Accordingly, the performance of the computing unit 310 may be improved. For example, the performance of the semiconductor device 100 including the command/address receiver 350 may be further improved.

Hereinafter, an electronic device 1 according to some example embodiments will be described with reference to FIG. 10.

Figure 10:
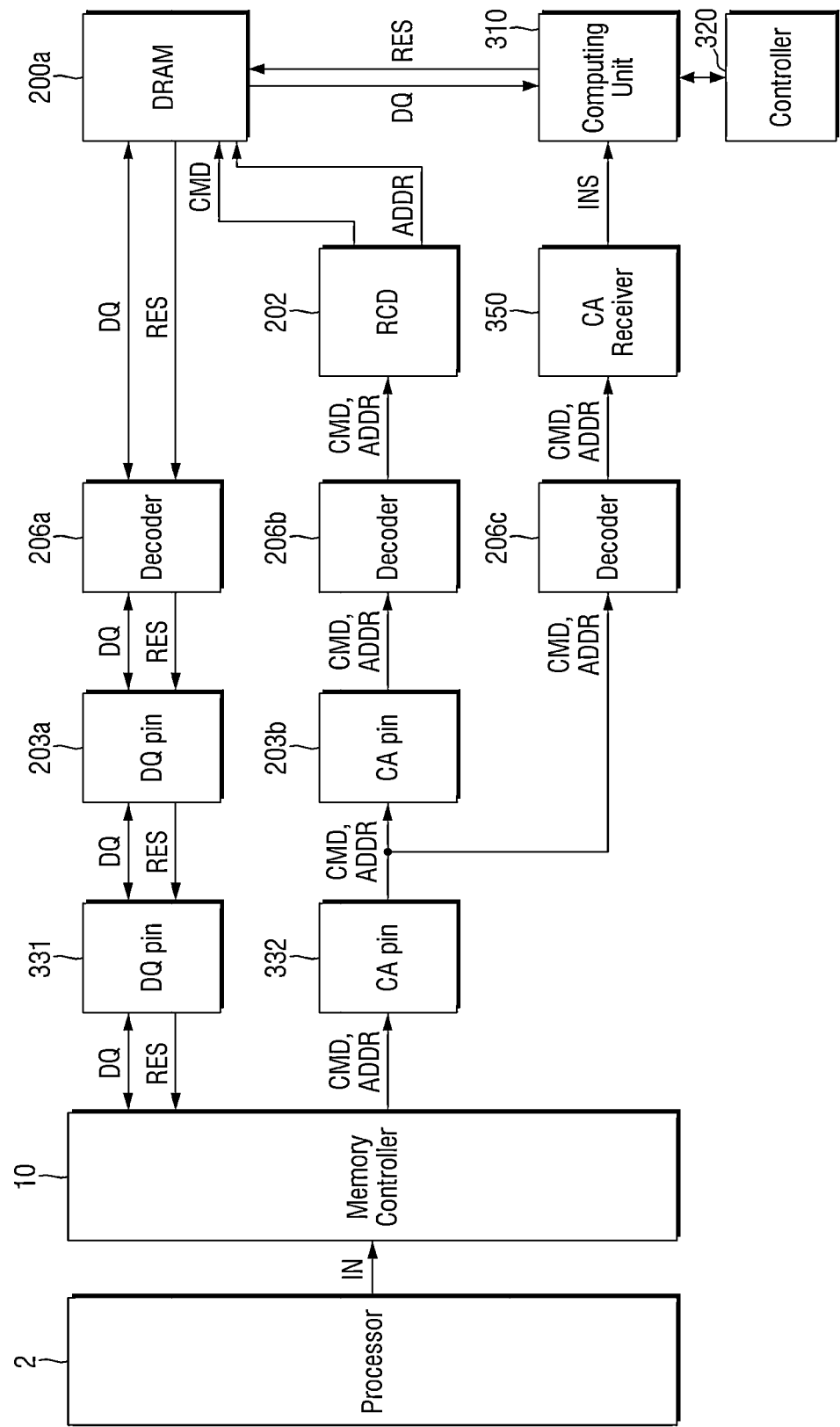
FIG. 10 is a block diagram of an electronic device according to some example embodiments.

FIG. 10 is a block diagram of an electronic device according to some example embodiments. For convenience of description, parts of FIG. 10 that are the same as those described above with reference to FIGS. 1 to 9 will be briefly described or omitted here.

Referring to FIG. 10, a computing unit 310 may receive a data signal DQ from a memory device 200a. Here, the data signal DQ may be or may include a signal obtained by reading data stored in the memory device 200a. However, when an instruction INS is transmitted to the memory device 200a, the data signal DQ may be different from a dummy data signal DQD written to the memory device 200a. For example, the data signal DQ transmitted to the computing unit 310 may be a signal that is written according to a command CMD and an address ADDR transmitted at a different timing from the command CMD and the address ADDR corresponding to the instruction INS.

The computing unit 310 may generate a response signal RES on the basis of the received instruction INS and data signal DQ. For example, the computing unit 310 may perform computation on the basis of the instruction INS and the data signal DQ. The computing unit 310 may output the response signal RES in response to the instruction INS and the data signal DQ. The response signal RES may be transmitted to the memory device 200a, and may be transmitted to a memory controller 10 through a data interface DQ IF. For example, the instruction INS may be received through a command/address interface CA IF, but the response signal RES may be received through the data interface DQ IF. In addition, a host 20 may receive the response signal RES in response to the command CMD, the address ADDR, and the data signal DQ. However, example embodiments of inventive concepts are not limited thereto.

Hereinafter, an electronic device 1 according to some other example embodiments will be described with reference to FIG. 11.

Figure 11:
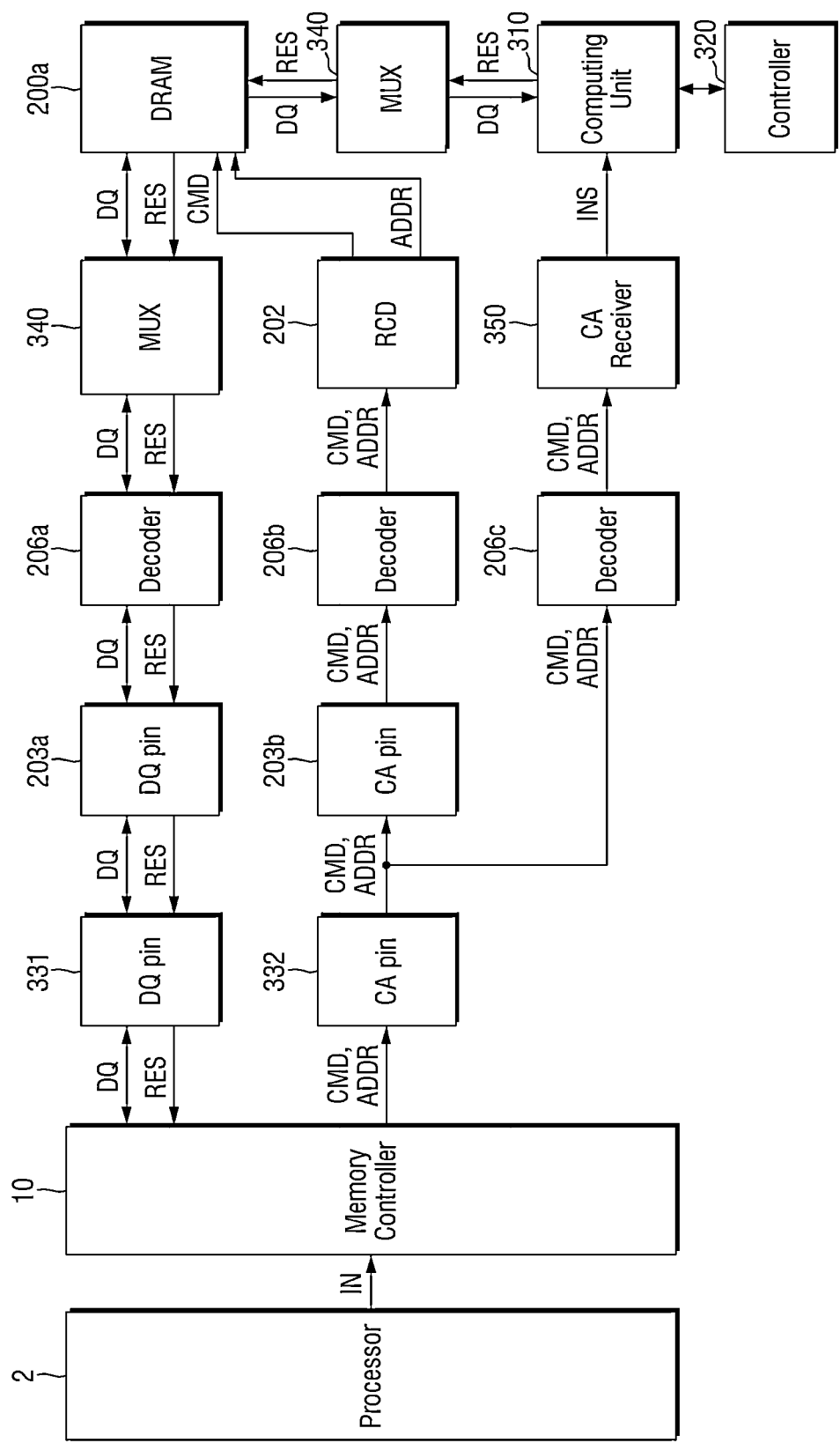
FIG. 11 is a block diagram of an electronic device according to some example embodiments.

FIG. 11 is a block diagram of an electronic device according to some example embodiments. For convenience of description, parts of FIG. 11 that are the same as those described above with reference to FIGS. 1 to 10 will be briefly described or omitted here.

Referring to FIG. 11, a computing device 300 may include a multiplexer 340. The multiplexer 340 may connect a decoder 206a and a memory device 200a, and may connect a computing unit 310 and the memory device 200a. In the drawings, the multiplexer 340 is illustrated as being two, but is not limited thereto, and may be implemented as one or more than two.

The multiplexer 340 may transmit a data signal DQ, which is output from the decoder 206a, to the memory device 200a, and transmit the data signal DQ, which is output from the memory device 200a, to the decoder 206a. In addition, the multiplexer 340 may transmit a response signal RES, which is output from the memory device 200a, to the decoder 206a. For example, the multiplexer 340 may connect the memory device 200a and the computing unit 310 to selectively transmit and receive data.

In addition, the multiplexer 340 may transmit the data signal DQ, which is output from the memory device 200a, to the computing unit 310, and transmit the response signal RES, which is output from the computing unit 310, to the memory device 200a. The multiplexer 340 may connect the memory device 200a and the computing unit 310 and selectively transmit and receive data.

Hereinafter, an electronic device 1 according to some other example embodiments will be described with reference to FIG. 12.

Figure 12:
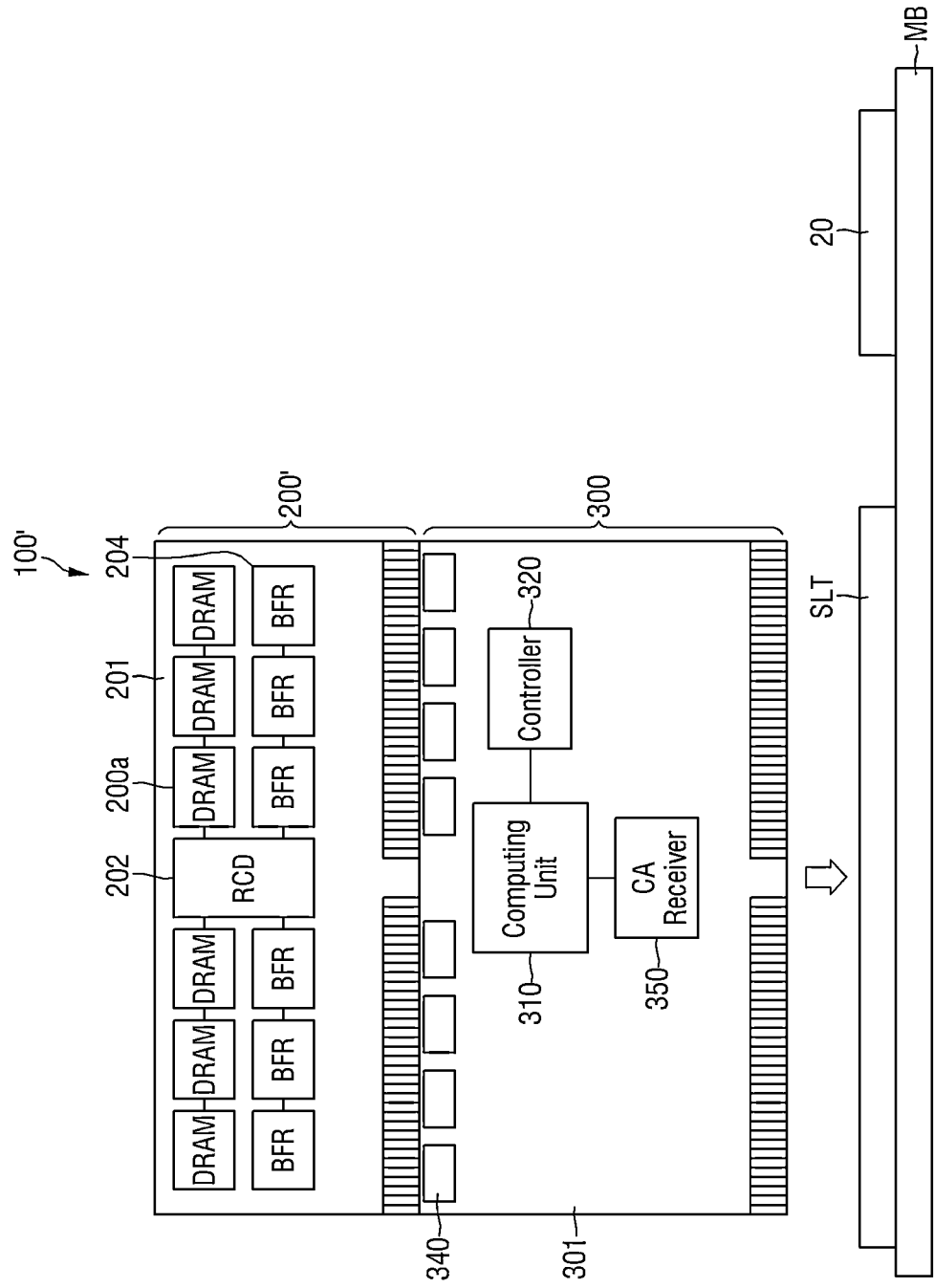
FIG. 12 is a diagram for describing an electronic device according to some example embodiments.

FIG. 12 is a diagram for describing an electronic device according to some example embodiments. For convenience of description, parts of FIG. 12 that are the same as those described above with reference to FIGS. 1 to 11 will be briefly described or omitted here.

Referring to FIG. 12, a semiconductor device 100' may include a memory device 200' and a computing device 300 connected to the memory device 200'. The memory device 200' may include a buffer 204. The buffer 204 may be disposed on a substrate 201 so as to correspond to each memory device 200a. For example, the number of buffers 204 may be equal to the number of memory devices 200a. The buffer 204 may be connected to each memory device 200a. In addition, the buffer 204 may be connected to an RCD 202 and may receive a plurality of signals from the RCD 202.

The buffer 204 may be connected to a data pin 203a and may receive a data signal DQ from a host 20 through the data pin 203a, and may buffer the received data signal DQ and transmit the buffered data signal DQ to the memory device 200a. Accordingly, an electrical load of the memory device 200a may be reduced. The memory device 200' may be referred to as a load reduced DIMM (LRDIMM).

Hereinafter, an electronic device 1 according to some other example embodiments will be described with reference to FIG. 13.

Figure 13:
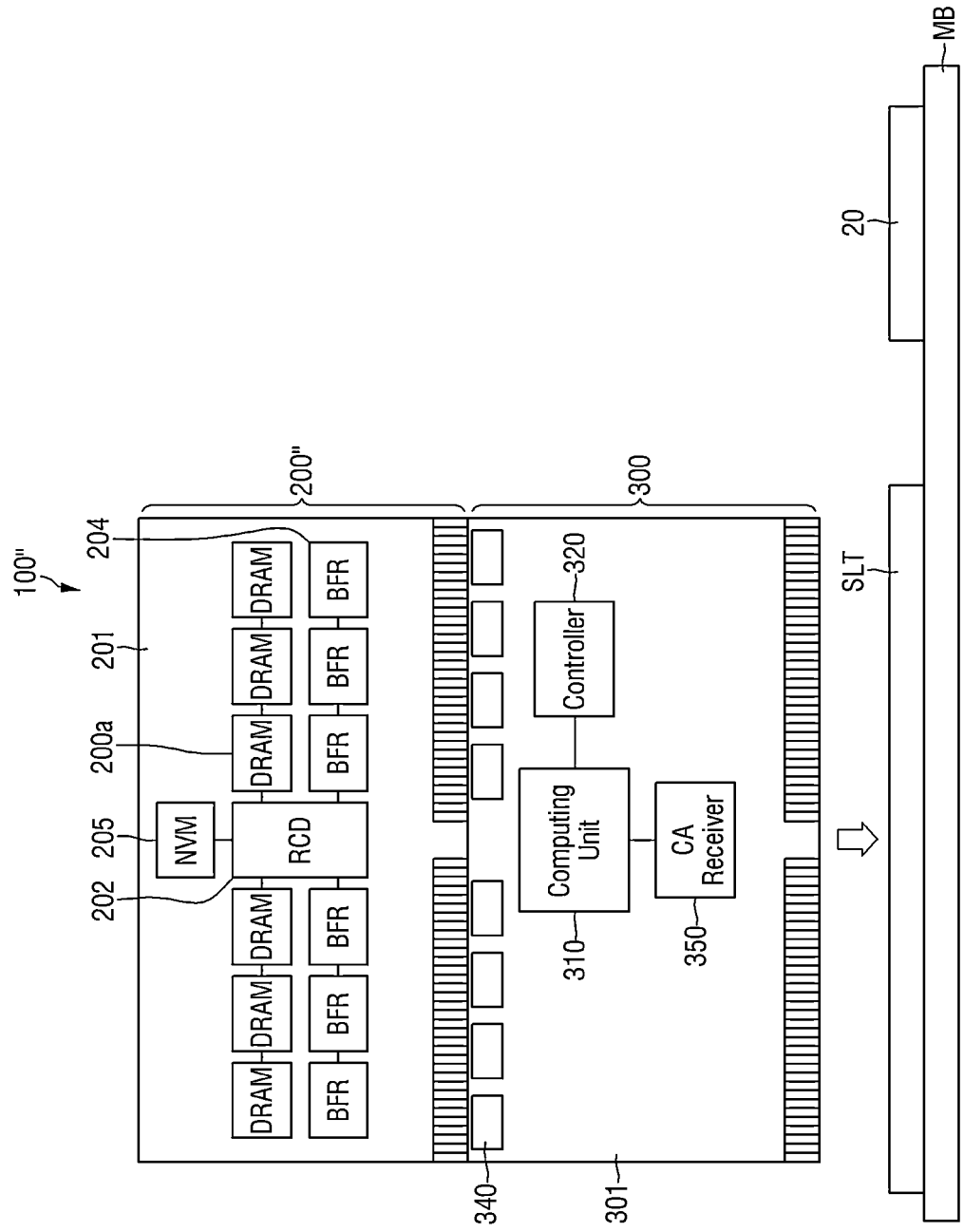
FIG. 13 is a diagram illustrating an electronic device according to some example embodiments.

FIG. 13 is a diagram illustrating an electronic device according to some example embodiments. For convenience of description, parts of FIG. 13 that are the same as those described above with reference to FIGS. 1 to 12 will be briefly described or omitted here.

Referring to FIG. 13, a semiconductor device 100" may include a memory device 200" and a computing device 300 connected to the memory device 200". The memory device 200" may include a non-volatile memory 205. The non-volatile memory 205 may be connected to an RCD 202. However, example embodiments of inventive concepts are not limited thereto, and the non-volatile memory 205 may be connected to each memory device 200a.

The non-volatile memory 205 may store data transmitted from a host 20 or the memory device 200a. The memory device 200a may be a volatile memory, but memory stored in the non-volatile memory 205 may be maintained. For example, when the memory device 200" includes the non-volatile memory 205, the data may be stored and maintained in the non-volatile memory 205 even when power applied to the memory device 200" is turned off.

Hereinafter, an electronic device 1 according to some other example embodiments will be described with reference to FIGS. 14 and 15.

Figure 14:
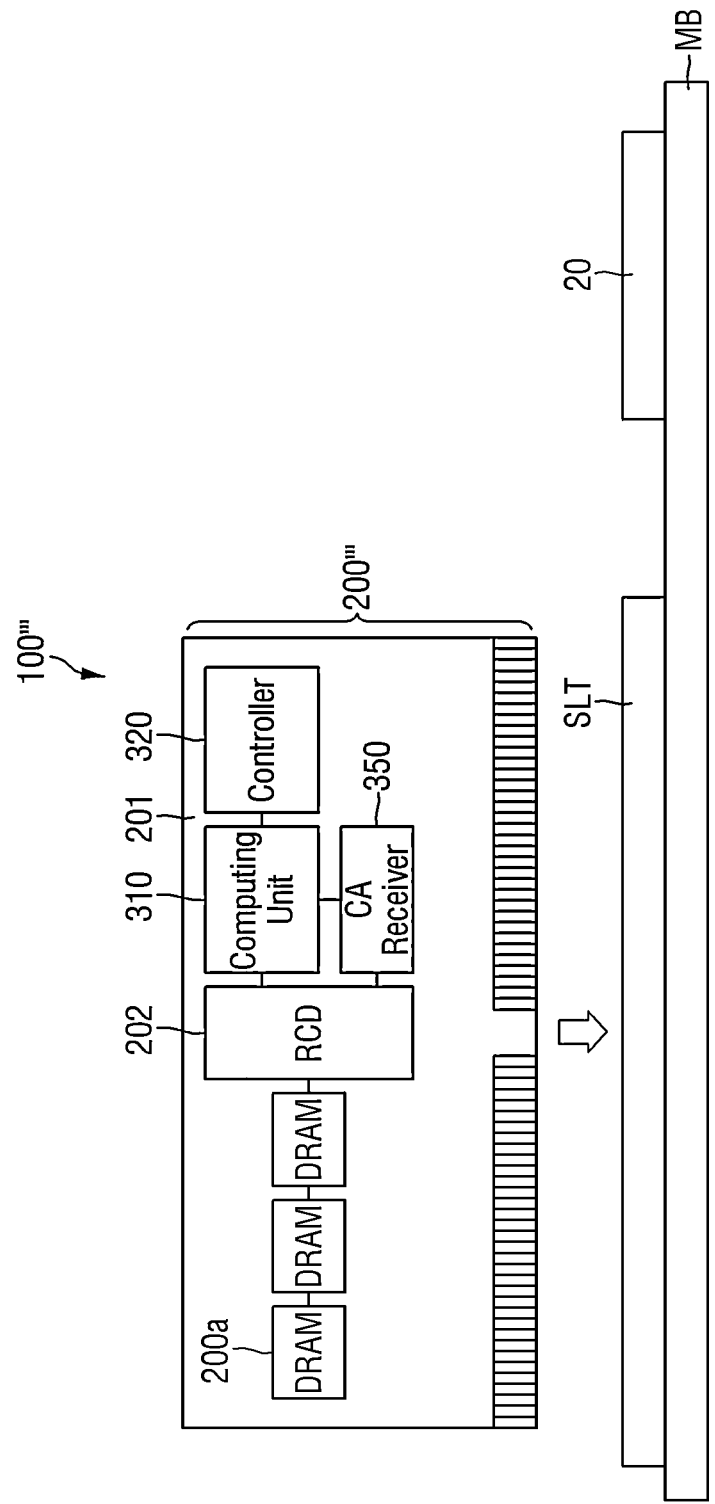
FIG. 14 is a diagram for describing an electronic device according to some example embodiments.

FIG. 14 is a diagram for describing an electronic device according to some example embodiments. FIG. 15 is a block diagram of the electronic device of FIG. 14. For convenience of description, parts of FIGS. 14 and 15 that are the same as those described above with reference to FIGS. 1 to 11 will be briefly described or omitted here.

Referring to FIG. 14, a semiconductor device 100''' may include a memory device 200'''. For example, the semiconductor device 100 described with reference to FIGS. 1 to 11 may include the computing device 300, but the semiconductor device 100''' described with reference to FIG. 14 may not include the computing device 300. The memory device 200''' may include a substrate 201, an RCD 202, a connection pin 203, a memory device 200a, a computing unit 310, a controller 320, and a command/address receiver 350. The computing unit 310, the controller 320, and the command/address receiver 350 may be mounted on the substrate 201, on which the memory device 200a is disposed, instead of being disposed on another substrate. The memory device 200a may be mounted on one side of the substrate 201, and the computing unit 310, the controller 320, and the command/address receiver 350 may be mounted on another side of the substrate 201. The memory device 200a, the computing unit 310, and the command/address receiver 350 may all operate by being connected to the RCD 202.

Figure 15:
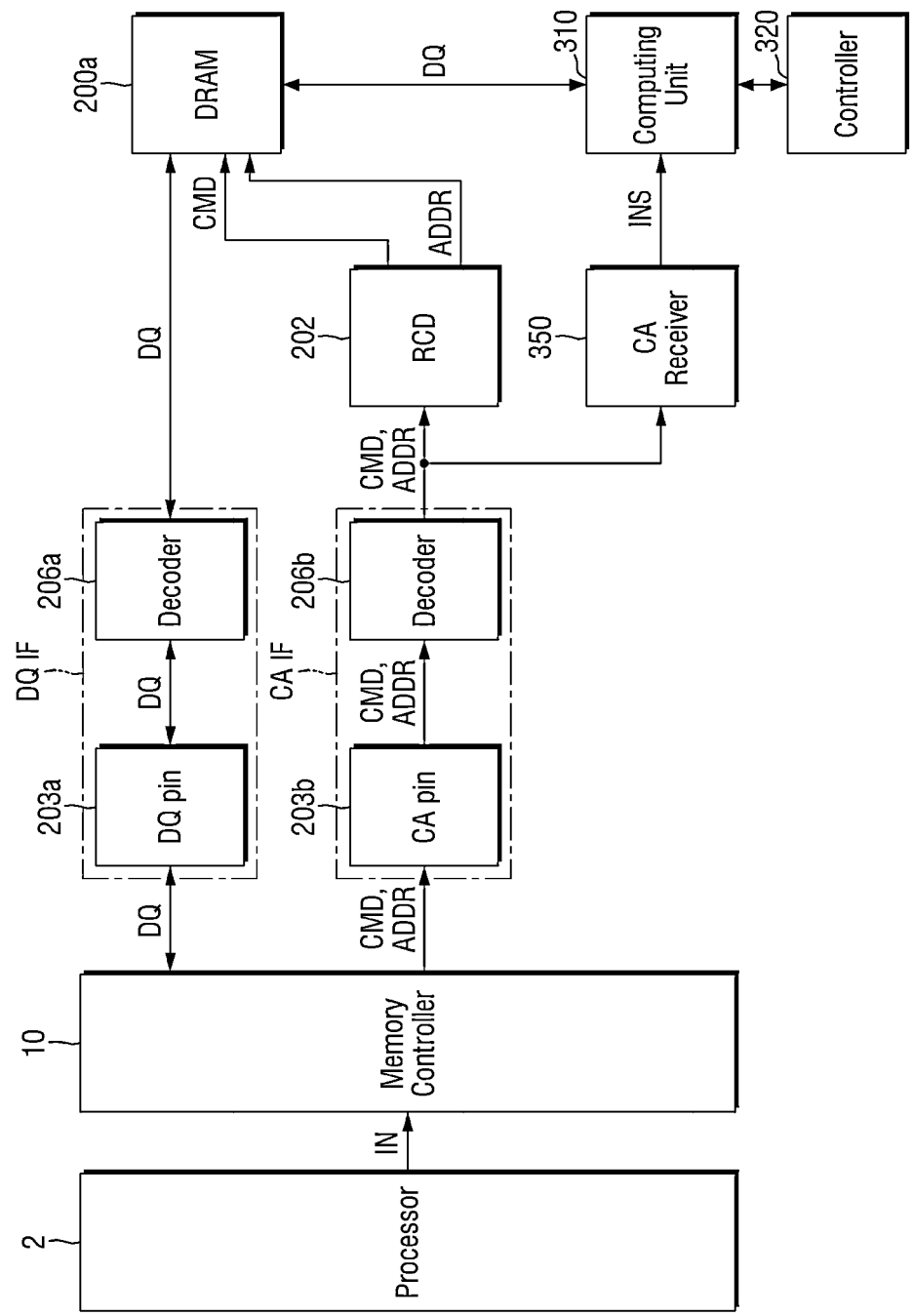
FIG. 15 is a block diagram of the electronic device of FIG. 14.

Referring to FIGS. 14 and 15, a data interface DQ IF may include a data pin 203a and a decoder 206a, and a command/address interface CA IF may include a command/address pin 203b and a decoder 206b. The memory device 200a may receive a signal transmitted through the data interface DQ IF and the command/address interface CA IF, and the command/address receiver 350 may receive a signal transmitted through the command/address interface CA IF. In this case, both the data interface DQ IF and the command/address interface CA IF may be implemented by the memory device 200". However, the example embodiment of inventive concepts is not limited thereto.

Example embodiments disclosed as above are not necessarily mutually exclusive. For example, some example embodiments may include some features disclosed with reference to one or more figures, and also may include other features disclosed with reference to one or more other figures.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Although example embodiments of inventive concepts have been described above with reference to the accompanying drawings, inventive concepts is not limited thereto and may be embodied in various different forms. It will be understood by those of ordinary skill in the art that inventive concepts may be implemented in other specific forms without departing from the technical spirit or essential features of inventive concepts. Accordingly, the example embodiments set forth herein should be considered only as examples and not for purposes of limitation.

What is claimed is:

1. A semiconductor device comprising:
a data pin configured to transmit a data signal;
a command/address pin configured to transmit a command and an address;
a command/address receiver circuitry connected to the command/address pin;
a processor connected to the command/address receiver circuitry; and
a memory device connected to the data pin and the command/address pin,
wherein the command/address receiver circuitry is configured to receive a first command and a first address from an outside through the command/address pin, and generate a first instruction based on the first command and the first address,
the processor is configured to receive the first instruction and perform a computation based on the first instruction, and
the memory device is configured to receive the data signal through the data pin, to receive the command through the command/address pin, to receive the address through the command/address pin, and to store the data signal based on the command and the address.

2. The semiconductor device of claim 1, wherein
the memory device is configured to provide the stored data signal to the processor, and
the processor is configured to perform computation on the data signal based on the first instruction and output a response signal.

3. The semiconductor device of claim 2, wherein the memory device is configured to receive the response signal.

4. The semiconductor device of claim 1, wherein the memory device is configured to receive the first command through the command/address pin and to receive the first address through the command/address pin, is configured to receive a dummy data signal through the data pin, and is configured to store the dummy data signal based on the first command and the first address.

5. The semiconductor device of claim 1, wherein the memory device includes a dual in-line memory module (DIMM).

6. The semiconductor device of claim 1, further comprising:
a multiplexer configured to connect the memory device and the processor, and configured to provide the stored data signal to the processor.

7. The semiconductor device of claim 1, wherein
the memory device is configured to generate a refresh address one time during a refresh address generation period, and
the command/address receiver circuitry is configured to receive a plurality of instructions from the outside through the command/address pin during the refresh address generation period.

8. The semiconductor device of claim 1, wherein the command/address receiver circuitry is directly connected to the command/address pin.

9. The semiconductor device of claim 1, wherein the first command includes a write command.

10. The semiconductor device of claim 1, wherein the command/address receiver circuitry is configured to receive a second address and a third address, which are different from the first address, the second address and the third address received from the outside through the command/address pin, is configured to generate a second instruction based on the first command and the second address, and is configured to generate a third instruction based on the first command and the third address.

11. The semiconductor device of claim 10, wherein
the command/address receiver circuitry is configured to generate a computation instruction based on the first to third instructions, and
the processor is configured to receive the computation instruction and to perform the computation.

12. The semiconductor device of claim 1, wherein the command/address receiver circuitry is configured to generate the first instruction in response to the first command being a write command.

13. A semiconductor device comprising:
a data pin configured to transmit a data signal;
a command/address pin configured to transmit a command and an address;
a command/address receiver circuitry connected to the command/address pin;
a processor connected to the command/address receiver circuitry; and
a memory device connected to the data pin and the command/address pin,
wherein the command/address receiver circuitry is configured to receive a first command and to consecutively receive a plurality of addresses other than the first command from an outside through the command/address pin, and generate an instruction based on the first command and the plurality of addresses by concatenating the plurality of addresses, and
the processor is configured to receive the first instruction and perform a computation based on the first instruction.

14. The semiconductor device of claim 13, wherein
the memory device is configured to provide the stored data signal to the processor, and
the processor is configured to perform computation on the data signal based on the first instruction and output a response signal.

15. The semiconductor device of claim 14, wherein the memory device is configured to receive the response signal.

16. The semiconductor device of claim 14, wherein the memory device is configured to receive the first command through the command/address pin and to receive the first address through the command/address pin, receive a dummy data signal through the data pin, and store the dummy data signal based on the first command and the first address.

17. The semiconductor device of claim 13, wherein the command/address receiver circuitry is directly connected to the command/address pin.

18. The semiconductor device of claim 13, wherein the first command includes a write command.

19. The semiconductor device of claim 13, wherein the command/address receiver circuitry is configured to generate the first instruction in response to the first command being a write command.

* * * * *